United States Patent [19]

Matsudo et al.

[11] Patent Number: 5,698,035
[45] Date of Patent: Dec. 16, 1997

[54] HEAT-RESISTANT ELECTRODE MATERIAL, ELECTRODE USING THE SAME, AND APPARATUS HAVING PLASMA GENERATING UNIT USING THIS ELECTRODE

[75] Inventors: Masahiko Matsudo; Akira Koshiishi, both of Kofu; Kei Isozaki; Yutaka Hirashima, both of Oomuta, all of Japan

[73] Assignees: Tokyo Electron Limited; Denki Kagaku Kogyo Kabushiki Kaisha, both of Tokyo, Japan

[21] Appl. No.: 782,939

[22] Filed: Jan. 13, 1997

Related U.S. Application Data

[60] Continuation of Ser. No. 402,360, Mar. 13, 1995, abandoned, which is a division of Ser. No. 153,426, Nov. 16, 1993, abandoned.

[30] Foreign Application Priority Data

Nov. 16, 1992 [JP] Japan ............................ 4-330072

[51] Int. Cl.$^6$ ............................................. C23C 16/00
[52] U.S. Cl. .................... 118/723 E; 118/723 ER; 156/345
[58] Field of Search .................. 118/723 E, 723 ER; 156/345; 204/298.39, 298.34

Primary Examiner—John Niebling
Assistant Examiner—Joni Y. Chang
Attorney, Agent, or Firm—Oblon, Spivak, McClelland, Maier & Neustadt, P.C.

[57] ABSTRACT

A heat-resistive electrode material substantially consisting of 40 to 60 wt % of at least one of $ZrB_2$ and $TiB_2$, 20 to 50 wt % of BN, and not more than 30 wt % of AlN is disclosed. This heat-resistive electrode material is used in at least portions of electrodes of an apparatus having a plasma generating unit, e.g., an ion source, a plasma etching apparatus, or a plasma CVD apparatus, that contacts a plasma.

6 Claims, 4 Drawing Sheets

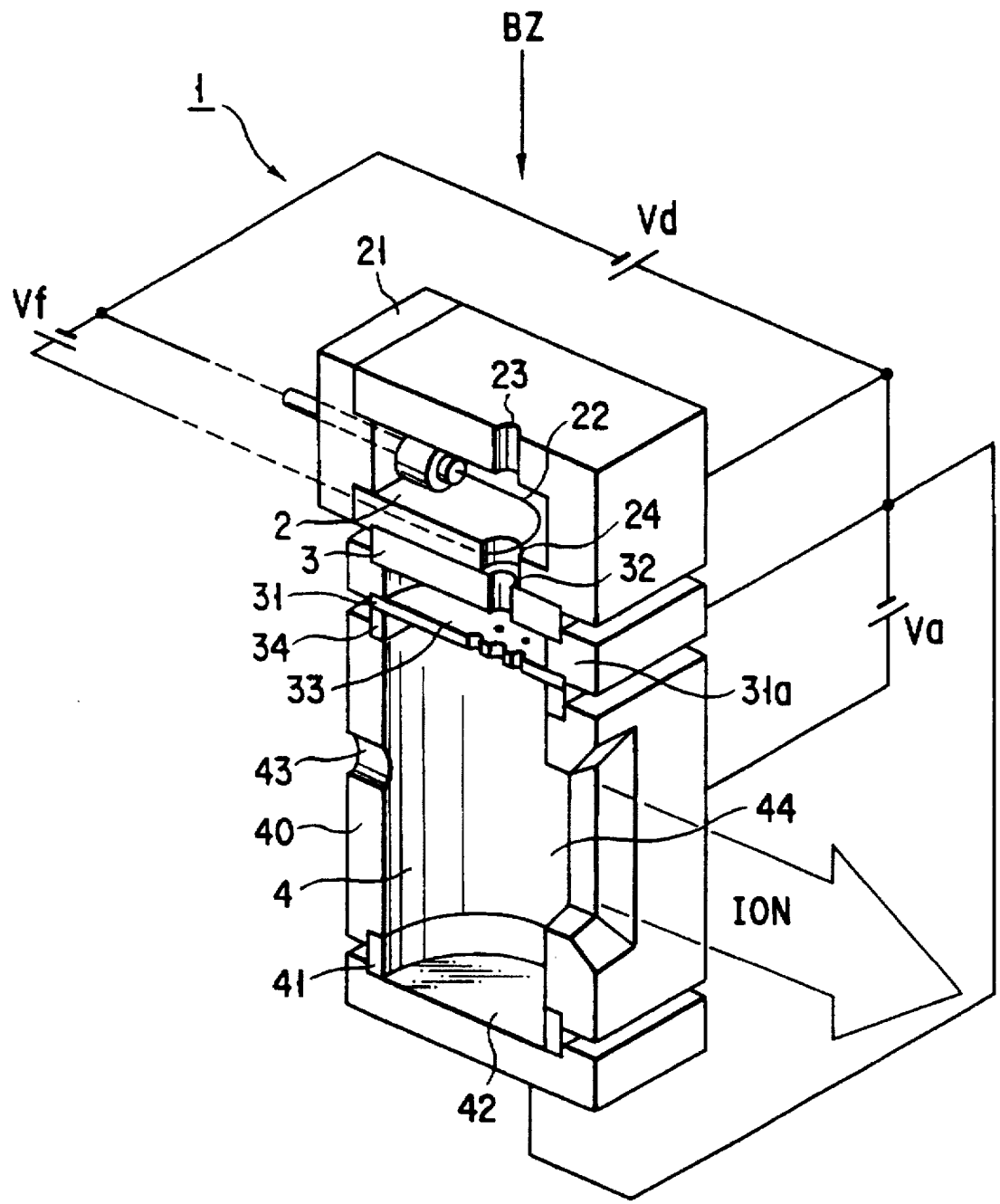
F I G. 1

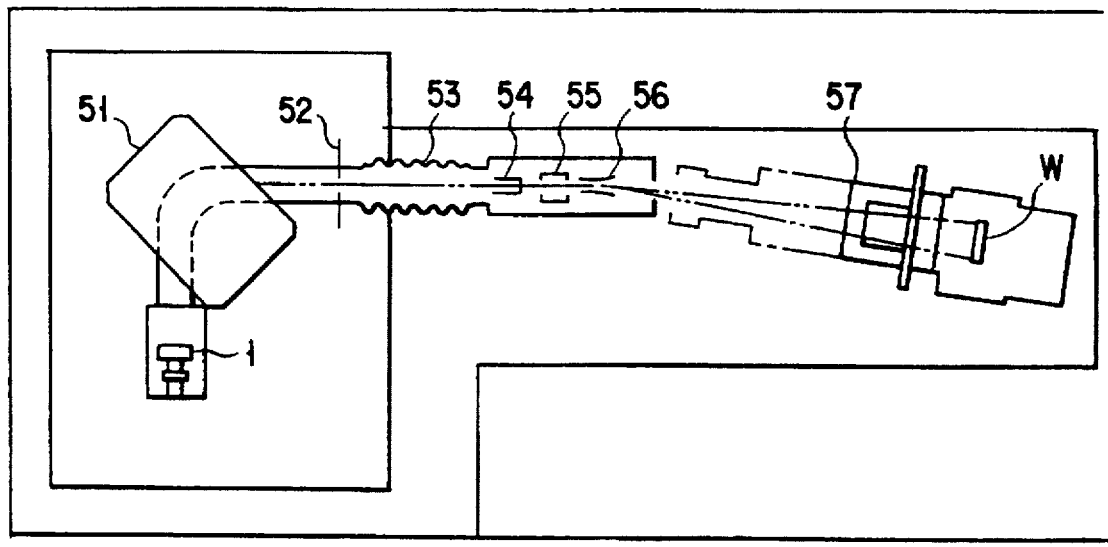
F I G. 3
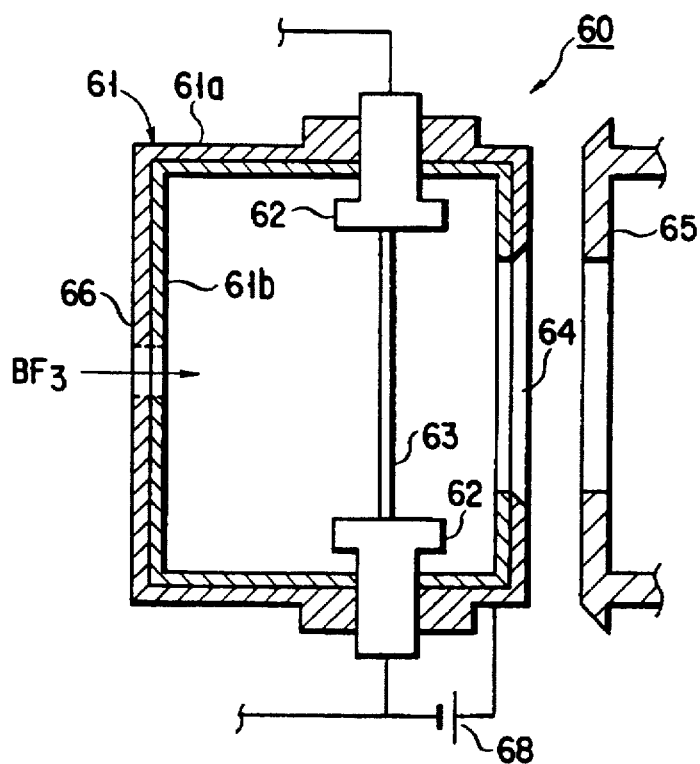
F I G. 4

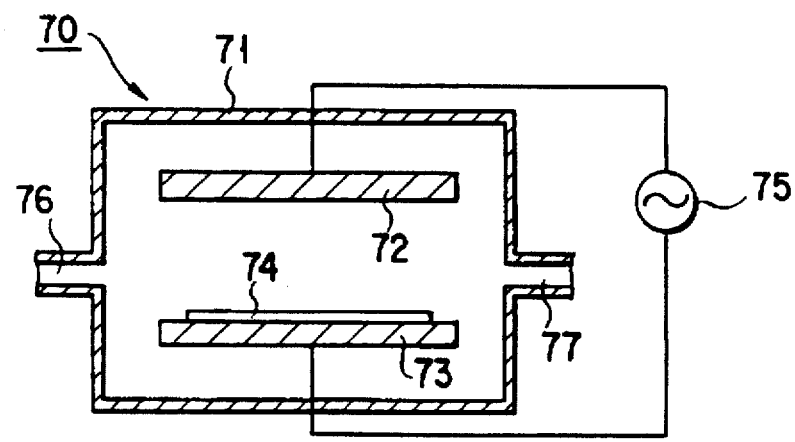
F I G. 5
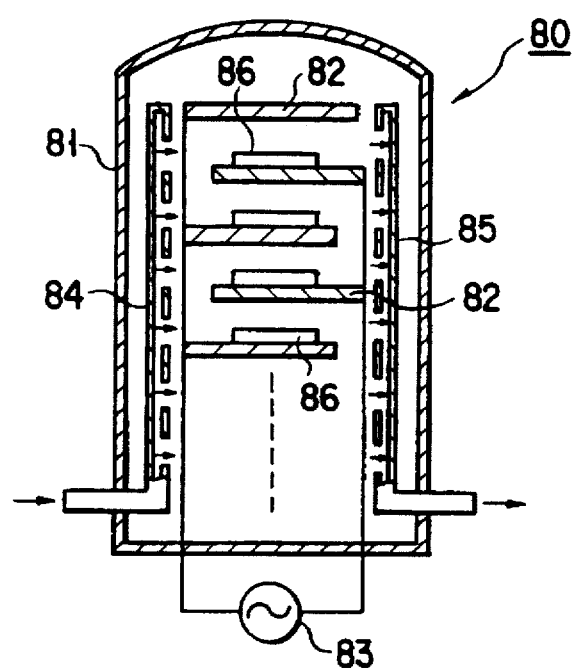
F I G. 6

HEAT-RESISTANT ELECTRODE MATERIAL, ELECTRODE USING THE SAME, AND APPARATUS HAVING PLASMA GENERATING UNIT USING THIS ELECTRODE

This application is a continuation of application Ser. No. 08/402,360, filed on Mar. 13, 1995, now abandoned, which is a Divisional of application Ser. No. 08/153,426, filed on Nov. 16, 1993, now abandoned.

BACKGROUND OF THE INVENTION

1. Field of the Invention

The present invention relates to a heat-resistive electrode material having a corrosion resistance, an electrode using the same, and a processing apparatus having a plasma generating unit, e.g., an ion source, a CVD apparatus, or an etching apparatus using this electrode.

2. Description of the Related Art

Apparatuses utilizing plasmas are widely used recently, and are especially used in, e.g., surface treatments in semiconductor manufacturing processes. For example, in an etching process, a process gas is fed into a chamber having electrodes, a voltage is applied across the electrodes to generate a plasma, and the etching process is directly performed by this plasma. In ion implantation, ions are extracted from a plasma generated in a chamber by electrodes, and ion implantation is performed by the ions.

An apparatus utilizing a plasma will be described by way of an ion source which is used in an ion-implanting apparatus that implants ions as an impurity in the surface of a semiconductor wafer. When the ion source is an electron beam excitation ion source, the ion source has an electron generating chamber provided with a filament and an ion generating chamber into which a process gas is fed. The electric discharge gas is transformed to a plasma in the electron generating chamber by heating the filament and an electric discharge voltage. At the same time, electrons are extracted from the plasma by an acceleration voltage and are bombarded on the process gas in the ion generating chamber to transform the process gas to a plasma. Then, ions are extracted from this plasma. In this apparatus, not only is the temperature remarkably increased by generation of the plasma, but also the apparatus is exposed to an atmosphere such as corrosive gas and ion. Accordingly, molybdenum (Mo) or tungsten (W) as a refractory metal are used as the material to contact such an atmosphere.

However, in the apparatus utilizing a conventional plasma, e.g., an ion source, the surface of a chamber made of, e.g., molybdenum and serving also as an electrode is chipped off and damaged by the function of sputtering or the like caused by the plasma. Especially, when a halide gas, e.g., $BF_3$, is used as the process gas, since the process gas has a very strong corrosiveness (reactivity), a strong chemical function is applied to the chamber in addition to the physical function of sputtering, thereby causing a very large damage to the chamber. Accordingly, the service life of the chamber and the electrode is short, and the running cost of the apparatus is increased since, molybdenum or the like is expensive.

Particles that are generated and scattered when the chamber and the electrode are chipped off, e.g., an insulating material such as molybdenum fluoride, attach to the ion extraction electrodes to contaminate it. In order to remove this pollutant, maintenance must be often performed. At the same time, the service life of the chamber is short as described above, and must be replaced after use for only a short period of time. Therefore, the operability of the apparatus is degraded, and the throughput is decreased.

SUMMARY OF THE INVENTION

The present invention has been made in view of the above situation, and has as its object to provide a heat-resistive electrode material having excellent corrosion- and heat-resistant properties and a long service life.

It is another object of the present invention to provide an electrode which is not easily damaged even in a plasma atmosphere.

It is still another object of the present invention to provide an apparatus having a plasma generating unit, in which damage to an electrode or a chamber serving also as an electrode caused by a plasma is suppressed, so that the frequency of maintenance is decreased, thereby improving the operability.

According to the first aspect of the present invention, there is provided an heat-resistive electrode material substantially consisting of 40 to 60 wt % of at least one of $ZrB_2$ and $TiB_2$, 20 to 50 wt % of BN, and 1 to 30 wt % of AlN.

According to the second aspect of the present invention, there is provided an electrode used in a plasma atmosphere and including a heat-resistive material essentially consisting of 40 to 60 wt % of at least one of $ZrB_2$ and $TiB_2$, 20 to 50 wt % of BN, and not more than 30 wt % of AlN.

According to the third aspect of the present invention, there is provided an apparatus having a plasma generating unit for electrically transforming a gas to a plasma, comprising: a chamber; means for feeding a plasma generating gas into the chamber; and a pair of electrodes for generating an electric field, thereby generating a plasma of the gas, wherein at least portions of the electrodes contacting the process gas are constituted by a heat-resistive material essentially consisting of 40 to 60 wt % of at least one of $ZrB_2$ and $TiB_2$, 20 to 50 wt % of BN, and not more than 30 wt % of AlN.

According to the fourth aspect of the present invention, there is provided an apparatus having a plasma generating unit for electrically transforming a gas to a plasma, comprising a chamber, means for feeding a plasma generating gas into the chamber, and a pair of electrodes for generating an electric field, thereby generating a plasma of the gas, wherein at least portions of the electrodes contacting the plasma are constituted by a hot-press sintered body, and the sintered body being arranged such that surfaces thereof parallel to a direction of pressure of hot press contact a plasma atmosphere.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing, by a section, part of an ion source according to the first embodiment of the present invention;

FIG. 3 is a schematic view showing an ion-implanting apparatus in which an ion source is incorporated;

FIG. 4 is a sectional view showing a Freeman ion source according to the third embodiment of the present invention;

FIG. 5 is a sectional view schematically showing the arrangement of a plasma etching apparatus according to the fourth embodiment of the present invention; and FIG. 6 is a sectional view schematically showing the arrangement of a plasma CVD apparatus according to the fifth embodiment of the present invention.

DETAILED DESCRIPTION OF THE PREFERRED EMBODIMENTS

Figure 2:
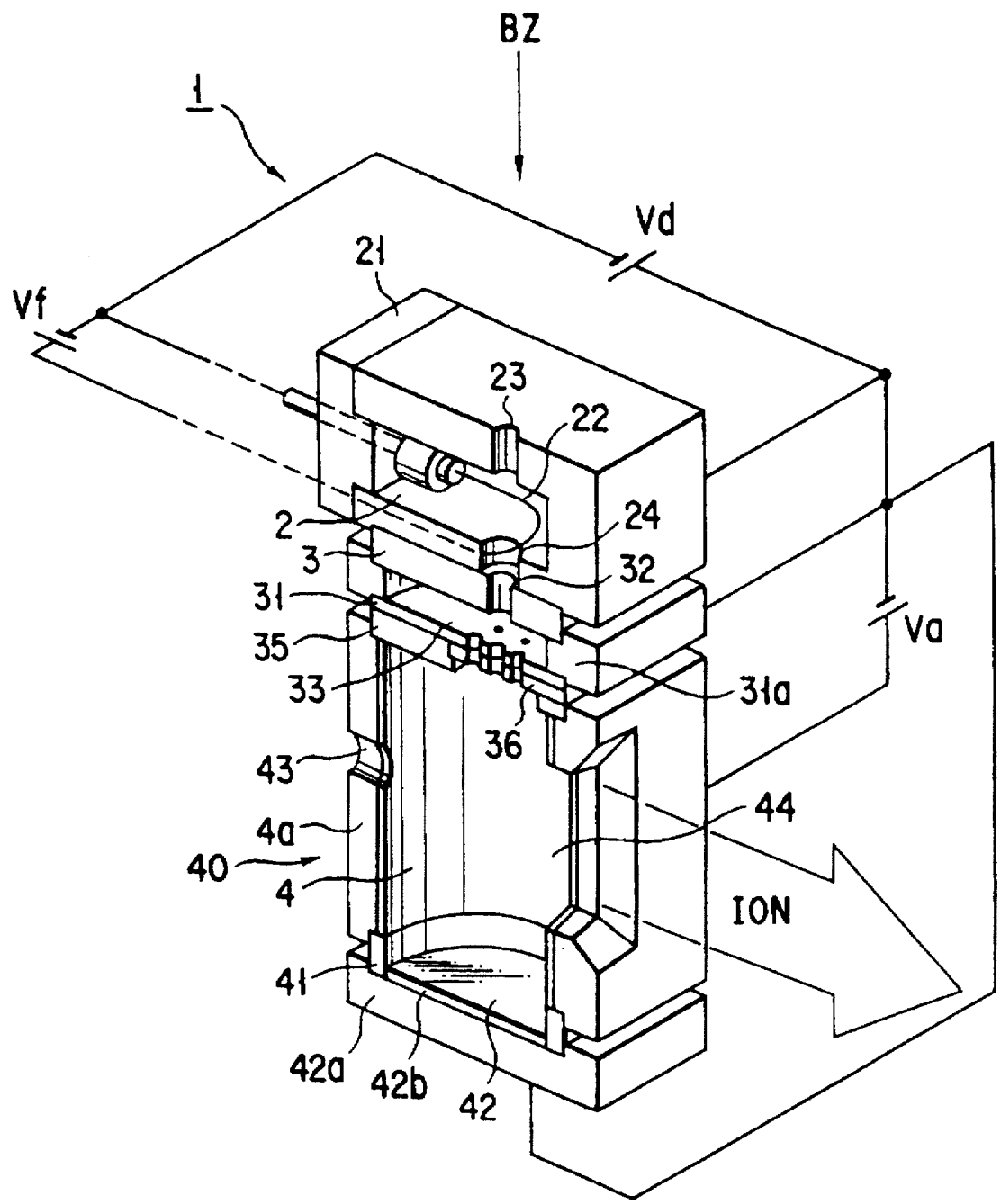
FIG. 2 is a perspective view showing, by a section, part of an ion source according to the second embodiment of the present invention.

The present inventors made an extensive study on a corrosion- and heat-resistive electrode material which can endure a plasma atmosphere, and found out that $ZrB_2$ and $TiB_2$ have high corrosion and heat resistances and good electrical conductivity, that desired characteristics can be obtained by causing at least one of $ZrB_2$ and $TiB_2$ to contain BN having a high thermal shock resistance, and that AlN is preferably used to improve the heat conductivity, thereby improving the thermal uniformity. The present inventors thus completed the present invention.

In the heat-resistive material according to the present invention, $ZrB_2$ and $TiB_2$ are electrically conductive, have a corrosion resistance and a high melting point, and are thus components indispensable in obtaining the above properties. In the present invention, it is desirable that the heat-resistive electrode material contains 40 to 60% of at least one of $ZrB_2$ and $TiB_2$. If the content is less than 40 wt %, the material has poor electrical conductivity and thus the function of the electrode is degraded. If the content exceeds 60 wt %, the thermal shock resistance and the like pose a problem.

As described above, BN is contained to impart the thermal shock resistance, and its content is 20 to 50 wt %. If the content is less than 20 wt %, a sufficient thermal shock resistance cannot be obtained. If the content exceeds 50 wt %, the plasma resistance and the corrosion resistance are degraded.

AlN is preferably contained because it has a function of improving the heat conductivity, and the content of AlN is preferably 30 wt % or less. If it exceeds 30 wt %, the plasma resistance and the corrosion resistance are degraded. The more preferable range of AlN is 1 to 30 wt %.

Although AlN is preferably added to impart the function described above, it is not indispensable. If AlN is not contained, the range of at least one of $ZrB_2$ and $TiB_2$ is 50 to 60 wt % and the range of BN is 40 to 50 wt %, inevitably contained.

$Si_3N_4$ or $Al_2O_3$ can be used in place of AlN. An effect similar to that obtained when AlN is added can be obtained in this case as well. Two or more of AlN, $Si_3N_4$, and $Al_2O_3$ may be added such that their total content is 30 wt % or less.

Such an heat-resistive electrode material is usually manufactured by uniformly mixing material powders having the above composition and sintering the powder mixture. The particle size of the material powder is 10 μm or less in average, and is preferably several μm or less. The higher the purity of the material, the better the result. To mix the powders, a ball mill, a vibrating mill, an attritor mill, or the like can be used, but the type of mill is not particularly limited. Various types of sintering methods are available, e.g., pressureless sintering, hot-press sintering, and HIP sintering. Since $ZrB_2$, $TiB_2$, and BN as components constituting the heat-resistive electrode material of the present invention are hard to sinter, hot-press sintering is suitable. The sintering temperature is, e.g., 1,800° to 2,100° C. and the pressure is, e.g., about several hundreds of kg/cm².

Since hot-press sintering has directivity in pressure, the texture of the sintered body is anisotropic. From the viewpoint of improving the corrosion resistance and heat resistance, it is preferable that a surface of the sintered body parallel to the direction of pressure of hot press is brought into contact with the plasma atmosphere.

In the present invention, the relative density of the sintered body is preferably 90% or more. If the relative density is lower than this, the porosity is increased to degrade the corrosion resistance and plasma resistance, and the amount of gas in the atmosphere to be adsorbed by the sintered body is increased. When this sintered body is used to form an electrode or the like, its function is deteriorated over time.

If the electrical resistivity exceeds $1 \times 10^5$ μΩ.cm, the corrosion resistance is degraded. Therefore, the electrical resistivity is preferably $1 \times 10^5$ μ.cm or less. However, if the above ranges of the composition are satisfied, a resistivity of $1 \times 10^5$ μΩcm or less is obtained. A more preferable range of the resistivity is $1 \times 10^2$ to $1 \times 10^5$ μΩ.cm.

The heat-resistive electrode material according to the present invention has, in addition to the electrical conductivity and the heat resistance, an excellent corrosion resistance, while having a high thermal shock resistance and good heat conductivity, so that it can be suitably used to form, e.g., an electrode of a plasma processing apparatus. In an apparatus having a plasma generating unit that uses this material to form an electrode, the damage to the surface of the electrode is suppressed as the thermal shock resistance of the electrode (including a chamber serving also as an electrode) is high. When the electrically conductive heat-resistive electrode material contains AlN, even when a large temperature difference is generated between one portion and the other of, e.g., the chamber serving an electrode, e.g., between outer and inner wall surfaces, since AlN has good heat conductivity, occurrence of cracking is prevented. In addition, due to the good heat conductivity again, the surface of the chamber is thermally uniformed to stabilize the plasma.

The reason why this heat-resistive material has an excellent damage resistance against the plasma is estimated as follows. That is, since the atomic bonds in $ZrB_2$ and/or $TiB_2$ are mostly covalent bonds to provide a very large bond strength, this heat-resistive material is not easily chipped off by physical bombardment with particles. In other words, it has an excellent sputtering resistance. Also, even when the material of $ZrB_2$ and/or $TiB_2$ is brought into contact with highly active particles obtained by transforming a halide gas, e.g., $BF_3$, having a high chemical reactivity, to a plasma, it is not easily corroded.

However, if the material contains only $ZrB_2$ and/or $TiB_2$, it does not have a very high thermal shock resistance which is a fracture resistance against a rapid temperature change, and if the temperature difference exceeds, e.g., about 300° C., a crack may be formed. In a plasma generating unit, e.g., the ion generating chamber of an ion source, the temperature difference between the outer and inner wall surfaces can exceed 500° C. In this case, if the material contains only $ZrB_2$ and/or $TiB_2$, a crack is very likely to be generated.

According to the present invention, BN having an excellent thermal shock resistance receives attention, and is made to be contained in the above electrically conductive electrode material. Although BN has an excellent thermal shock resistance, it does not have a very high sputtering or corrosion resistance. Hence, $ZrB_2$ and/or $TiB_2$, and BN are mixed in the ranges described above to compensate for their respective drawbacks, thereby providing excellent heat resistance, corrosion resistance, sputtering resistance, and thermal shock resistance. When AlN is further contained in this material, the heat conductivity can be increased, thereby improving the thermal uniformity and the like. As a result, this heat-resistive electrode material is further stable in the plasma atmosphere.

An embodiment wherein the above heat-resistive electrode material is applied to an electron beam excitation ion source will be described. As shown in FIG. 1, an electron generating chamber 2 formed as a rectangular container having sides of about several cm is provided at the upper portion of an ion source 1. An insulating plate 21 is provided to close an opening formed in one side surface of the electron generating chamber 2. A U-shaped filament 22 made of, e.g., tungsten, projects into the electron generating chamber 2 as its two ends are supported by the insulating plate 21.

An electric discharge gas feed port 23 for feeding an electric discharge gas, e.g., the Ar gas, is formed in the ceiling portion of the electron generating chamber 2. A plasma cathode chamber 31 is formed under the electron generating chamber 2 through an insulating member 3. The plasma cathode chamber 31 is defined by a side wall 31a. Round hole paths 24 and 32 are respectively formed in the bottom plate of the electron generating chamber 2 and the insulating member 3 so as to allow the electron generating chamber 2 and the plasma cathode chamber 31 to communicate with each other.

The bottom wall of the plasma cathode chamber 31 is defined by an electron extraction electrode 33 having a plurality of electron passing through holes and a plurality of degassing through holes formed around them. An ion generating chamber 4 is connected to the lower portion of the electron extraction electrode 33 through an insulating member 34. The ion generating chamber 4 is defined by a side wall 40 having an outer rectangular portion and an inner cylindrical portion. A bottom wall 42 of the ion generating chamber 4 is separated from the side wall 40 by an insulating member 41. A process gas feed port 43 for feeding a process gas, e.g., $BF_3$ gas, for generating a desired ion species into the ion generating chamber 4 is formed in the side wall 40 of the ion generating chamber 4, and an ion extracting slit aperture 44 is formed at a portion of the side wall 40 opposing the process gas feed port 43.

A voltage application portion of the ion source 1 will be described. A filament power supply Vf is connected between the two ends of the filament 22, and an electric discharge power supply vd is connected between one end of the filament 22 and the wall portion of the electron generating chamber 2. An acceleration power supply Va is connected between the electron extraction electrode 33 and the wall portion of the ion generating chamber 4, and the negative terminal of the acceleration power supply Va, the positive terminal of the electric discharge power supply vd, and the bottom wall 42 of the ion generating chamber 4 are electrically connected to each other.

The electron extraction electrode 33 and the side wall 40 and the bottom wall 42 of the ion generating chamber 4, serving as an electrode to be brought into contact with the plasma, are made of the heat-resistive material according to the present invention described above. The electron generating chamber 2, and the side wall 31a of the plasma cathode chamber 31 are also made of the same heat-resistive material. Namely, these portions are constituted by sintered bodies each containing 40 to 60 wt % of $ZrB_2$ and/or $TiB_2$, 20 to 50 wt % of BN, and 30 wt % or less of AlN. Especially, it is preferable that the content of $ZrB_2$ and/or $TiB_2$ is 40 to 60 wt %, that the content of BN is 20 to 50 wt %, and that the content of AlN is 1 to 30 wt %.

In the ion source constituted in this manner, a magnetic field for guiding the electrons in the electron extracting direction is applied by a magnetic field generating means (not shown), as indicated by an arrow BZ in FIG. 1, and predetermined voltages are applied to the respective portions of the ion source by the filament power supply Vf, the electric discharge power supply Vd, and the acceleration power supply Va. For example, Argon gas is fed into the electron generating chamber 2 through the electric discharge gas feed port 23 at 0.05 to 0.7 SCCM to cause electric discharge, thereby generating a plasma. The electrons in this plasma are accelerated by the electric field and extracted into the plasma cathode chamber 31 through the round hole paths 24 and 32. The extracted electrons are then partly accelerated by the acceleration voltage Va and extracted into the ion generating chamber 4 through the through holes in the electron extraction electrode 33.

A plasma generating gas, e.g., $BF_3$ gas, is fed into the ion generating chamber 4 through the process gas feed port 43 at a flow rate of, e.g., 0.1 to 1.0 SCCM. The electrons flowing into the ion generating chamber 4 are bombarded on the molecules of the $BF_3$ gas to generate a dense plasma. Ions are extracted from this plasma to the outside by an ion extraction electrode (not shown) through the ion extracting slit aperture 44, and are radiated to scan a semiconductor wafer as a target, thereby implanting ions in the semiconductor wafer.

In this embodiment, a highly corrosive process gas, e.g., the BF3 gas, is excited upon being irradiated with electrons and transformed to a highly reactive plasma by the function of a magnetic field BZ and the like, and the inner wall surface of the ion generating chamber 4 is exposed to this plasma. Since the ion generating chamber 4 is constituted by the heat-resistive electrode material according to the present invention, it has a low reactivity with the process gas. Especially, since the electron extraction electrode 33 and the bottom wall 42 of the ion generating chamber 4 are at a negative potential, they are bombarded by ions in the plasma with a large kinetic energy, thereby being subjected to a physical action in addition to a chemical action. However, since the above electrically conductive electrode material has a high sputtering resistance, the damage to the electron extraction electrode 33 and the bottom wall 42 of the ion generating chamber 4 can be suppressed to a considerable degree. Accordingly, the service life of the ion generating chamber 4 is prolonged, and contamination of the electron extraction electrode 33 and the like can be decreased. Then, the frequency of maintenance can be decreased, thereby improving the operability of the apparatus.

The reason why the damage to the side wall 40 and the bottom wall 42 constituting the ion generating chamber 4 can be suppressed is as follows. That is, as described above, since the atomic bonds in $ZrB_2$ and/or $TiB_2$ as the major components of the electrically conductive ceramic are mostly covalent bonds, a very large bond strength can be obtained. More specifically, as the side wall 40 and the bottom wall 42 have a very large bond strength, they are not easily chipped off by bombardment with physical particles.

In other words, they have an excellent sputtering resistance. Also, even when the side wall 40 and the bottom wall 42 are brought into contact with highly active particles obtained by transforming a halide gas, e.g., $BF_3$, having a high chemical reactivity, to a plasma, they are not easily corroded.

If the material contains only $ZrB_2$ and/or $TiB_2$, the thermal shock resistance and the like pose a problem. Since the temperature difference between the outer and inner wall surfaces of the ion generating chamber 4 sometimes exceeds 500° C. depending on the locations, if the heat-resistive material contains only $ZrB_2$ and/or $TiB_2$, a crack is very likely to be generated. In order to avoid this, the heat-resistive electrode material of the present invention contains BN having an excellent thermal shock resistance. BN, however, does not have a very high sputtering or corrosion resistance. Therefore, $ZrB_2$ and/or $TiB_2$, and BN are mixed in the content of the present invention, so that the material has excellent heat resistance, corrosion resistance, sputtering resistance, and thermal shock resistance. Furthermore, AlN is mixed in the above composition. Since the AlN has an excellent heat conductivity, the inner wall surface of the ion generating chamber 4 is thermally uniformed. Then, the plasma is further stabilized.

According to the present invention, in place of constituting the electrode (including one that serves as both an electrode and a chamber) entirely by the electrically conductive heat-resistive electrode material described above, only a surface portion of the electrode brought into contact with the plasma may be constituted by the electrically conductive ceramic. As shown in FIG. 2, an ion generating chamber and the like may have a double structure of a metal, e.g., molybdenum, and the heat-resistive electrode material.

More specifically, in the embodiment shown in FIG. 2, an electron extraction electrode 33 is constituted by a refractory metal, e.g., molybdenum, and a protection plate consisting of an insulating member 35 and a conductive plate 36 (in which through holes corresponding to the through holes formed in the electron extraction electrode 33 are formed) made of the electrically conductive heat-resistive electrode material described above is adhered to the lower surface of the electron extraction electrode 33. A side wall 40 of an ion generating chamber 4 is constituted by an outer cylindrical portion 4a made of, e.g., molybdenum, and an inner cylindrical portion (liner) 4b formed on the inner surface of the outer cylindrical portion 4a and made of the heat-resistive electrode material described above. A bottom wall 42 of the ion generating chamber 4 is constituted by forming, on the inner surface of an outer sheath plate 42a made of, e.g., molybdenum, an inner sheath plate 42b made of the heat-resistive electrode material described above.

In the embodiments shown in FIGS. 1 and 2, in addition to the respective members defining the electron generating chamber 4, members constituting the electron generating chamber 2 and the plasma cathode chamber 31 are also composed of the heat-resistive electrode material described above. However, the electron generating chamber 2 and the plasma cathode chamber 31 need not necessarily be constituted by this electrode material, but can be constituted by an electrically conductive refractory metal, e.g., molybdenum.

An example of the entire arrangement of an ion-implanting apparatus using the ion source 1 described above will be described with reference to FIG. 3. A mass analyzer magnet 51, a variable slit 52, and an acceleration tube 53 are provided along the radiation path of an ion beam emitted by the ion source 1, and an electrostatic quadrupole lens 54, a Y-scan electrode 55, and an X-scan electrode 56 are arranged at the output side of the acceleration tube 53. Accordingly, after the ion beam passes through the magnet 51 so that the ions of the unnecessary impurities are removed, it is accelerated by the acceleration tube 53, is scanned with a predetermined pattern by the scan electrodes 55 and 56, and is radiated on a semiconductor wafer W in a Faraday cup 57, thereby performing predetermined ion implantation.

An embodiment of the present invention which is applied to a Freeman ion source will be described with reference to FIG. 4. As shown in FIG. 4, a cylindrical chamber 61 is provided in a Freeman ion source 60, and a rod-like filament 63 having two end portions supported by insulating support members 62 is provided in the chamber 61 to extend through the chamber 61.

An ion extraction aperture 64 is provided at the front portion of the interior of the chamber 61, and an ion extraction electrode 65 is provided to oppose the ion extraction aperture 64. A process gas feed aperture 66 is formed at the rear portion of the chamber 61.

The chamber 61 has a base material 61a made of molybdenum and a liner 61b provided to cover the inner side of the base material 61a. The liner 61b is constituted by the heat-resistive electrode material according to the present invention in the same manner as in the embodiments described above.

In the Freeman ion source 60 having the arrangement described above, a predetermined voltage is applied to the filament 63 by a filament power supply (not shown) to flow a current of, e.g., 50 to 200 A to it. At the same time, an electric discharge voltage of about, e.g., 80 to 100 V, is applied across the filament 63 and the chamber 61 by an electric discharge power supply 68. A predetermined process gas (material gas), e.g., $BF_3$ gas, is fed into the chamber 61 through the process gas feed aperture 66 in order to cause electric discharge in the chamber 61, thereby ionizing this process gas. The ions of the ionized gas are extracted by the ion extraction electrode 65 through the ion extraction aperture 64, and are implanted in, e.g., a semiconductor wafer.

In the embodiment of FIG. 4, since the electric discharge voltage is applied by the electric discharge power supply 68 so that the chamber 61 is set at a positive potential with respect to the filament 63, a plasma is generated in the vicinity of the ion extraction aperture 64 of the chamber 61. As described above, since the inner side of the chamber 61 forms the liner 61b made of the heat-resistive electrode material, as described above, the chamber 61 can be prevented from being corroded by a corrosive gas, e.g., the $BF_3$ gas, thereby obtaining the same effect as that described above.

This embodiment exemplifies a case wherein the liner 61b made of the heat-resistive material is provided. However, the chamber 61 can be entirely constituted by the heat-resistive electrode material, as a matter of course.

The present invention is not limited to the ion implanting apparatus and the ion source used in it, which are described above, but can be applied to a plasma etching apparatus, a plasma film deposition apparatus, and the like that directly process an object to be processed by a plasma.

A case wherein the present invention is applied to a plasma etching apparatus will be described. FIG. 5 is a sectional view showing the schematic arrangement of a plasma etching apparatus according to the present invention. As shown in FIG. 5, a chamber 71 made of, e.g., quartz, and capable of hermetically sealing its interior is provided to a plasma etching apparatus 70. Disk-shaped upper and lower electrodes 72 and 73 are provided in the chamber 71 to oppose each other in a parallel manner. A semiconductor wafer 74 as an object to be processed can be disposed on the lower electrode 73. The upper and lower electrodes 72 and 73 are made of the heat-resistive electrode material described above and are connected to a RF power supply 75. A feed pipe 76 for feeding a process gas and an exhaust pipe 77 for discharging an exhaust gas are connected to the chamber 71.

In this apparatus, the opening/closing mechanism (not shown) of the chamber 71 is opened, the semiconductor wafer 74 is placed on the lower electrode 73, and the opening/closing mechanism is closed to hermetically seal the interior of the chamber 71. Thereafter, the exhaust gas is discharged through the exhaust pipe 77, and a predetermined process gas (e.g., $Cl_2$, $SF_6$, $CHF_3$, $CF_4$, $BCl_3$, or HBr as a highly corrosive etching gas) is fed through the feed pipe 76 to set the interior of the chamber 71 to an atmosphere of a predetermined pressure. A power having a predetermined frequency, e.g., 2.45 GHz, 13.75 MHz, or 435 kHz, is applied across the upper and lower electrodes 72 and 73 by the RF power supply 75. Thus, the process gas is transformed to a plasma to act on the semiconductor wafer 74, thereby performing etching.

In this embodiment, the upper and lower electrodes 72 and 73 are made of the heat-resistive electrode material according to the present invention in the same manner as in the embodiments described above. Accordingly, the upper and lower electrodes 72 and 73 can be prevented from being damaged by the plasma, thereby obtaining the same effect as that described above.

A case wherein the present invention is applied to a plasma CVD apparatus as a plasma film deposition apparatus will be described. FIG. 6 is a sectional view showing the schematic arrangement of a plasma CVD apparatus according to the present invention. As shown in FIG. 6, a cylindrical chamber 81 made of, e.g., quartz, and capable of hermetically sealing its interior is provided to a plasma CVD apparatus 80. Disk-shaped electrode plates 82 are aligned in the chamber 81 in a shelf-like manner. The electrode plates 82 are alternately connected to the opposite poles of a RF power supply 83. These electrode plates 82 are made of the heat-resistive material according to the present invention in the same manner as in the above embodiments.

A process gas feed portion 84 and an exhaust portion 85 are provided in the chamber 81 to oppose each other through the array of the electrode plates 82. As indicated by arrows, a predetermined process gas (e.g., $WF_6$, $TiCl_4$, $SiH_4$, $Si_2H_6$, or $SiH_2Cl_2$ as a highly corrosive CVD process gas) can be flowed between the electrode plates 82.

In this embodiment, semiconductor wafers 86 are placed on the respective electrode plates 82 excluding the uppermost electrode plate, the predetermined exhaust gas is discharged through the exhaust portion 85, and the predetermined process gas is fed through the process gas feed portion 84. Hence, while the predetermined process gas is flowed between the respective electrode plates 82, a RF power is applied across the electrode plates 82 by the RF power supply 83, so that the process gas is transformed to a plasma, thereby forming CVD films on the respective semiconductor wafers 86.

In this embodiment, since the respective electrode plates 82 are made of the heat-resistive electrode material according to the present invention, these electrode plates 82 can be prevented from being damaged by the plasma, thereby obtaining the same effect as in the above embodiments.

In the apparatuses shown in FIGS. 5 and 6, at least a portion of each electrode that contacts the plasma may be made of the heat-resistive electrode material according to the present invention, as a matter of course.

EXAMPLES

Practical examples of the heat-resistive material of the present invention will be described together with comparative examples.

Materials including $ZrB_2$ and $TiB_2$ each having an average particle size of 8 μm, BN having an average particle size of 3 μm, and AlN having an average particle size of 2 μm were mixed in a ball mill with various proportions indicated in Table 1, and hot-press sintered in a nitrogen atmosphere at a temperature of 2,000° C. for 2 hours, thereby obtaining sintered bodies. The electrical resistivities of the resultant sintered bodies were measured, and the thermal shock resistance and corrosion resistance of the sintered bodies were evaluated. Table 1 shows the results.

TABLE 1

| Experiment No. | Composition (wt %) | | | | Electrical Resistivity | Thermal Shock | | Corrosion |
|---|---|---|---|---|---|---|---|---|
| | ZrB2 | TiB2 | BN | AlN | (μΩ · cm) | Resistance | Sample | Resistance |
| 1 | 35 | | 55 | 10 | >$10^6$ | O | Parallel Sample | X |
| 2 | 40 | | 45 | 15 | 1 × $10^5$ | O | Parallel Sample | ⊙ |
| 3 | 40 | | 45 | 15 | 1 × $10^5$ | O | Perpendicular Sample | O |
| 4 | 40 | | 55 | 5 | >$10^6$ | O | Perpendicular Sample | X |
| 5 | 50 | | 15 | 35 | 6 × $10^2$ | X | — | — |
| 6 | 50 | | 20 | 30 | 7 × $10^2$ | O | Parallel Sample | ⊙ |
| 7 | 50 | | 20 | 30 | 7 × $10^2$ | O | Perpendicular Sample | O |
| 8 | 50 | | 35 | 15 | 5 × $10^3$ | O | Parallel Sample | ⊙ |
| 9 | 50 | | 40 | 10 | 5 × $10^3$ | O | Perpendicular Sample | O |
| 10 | 50 | | 49 | 1 | 6 × $10^3$ | O | Parallel Sample | ⊙ |
| 11 | 60 | | 10 | 30 | 4 × $10^2$ | X | — | — |
| 12 | 60 | | 25 | 15 | 5 × $10^2$ | O | Parallel Sample | ⊙ |
| 13 | 70 | | 20 | 10 | 8 × 10 | X | — | — |
| 14 | | 40 | 40 | 20 | 2 × $10^5$ | O | Parallel Sample | X |
| 15 | | 55 | 30 | 15 | 5 × $10^2$ | O | Parallel Sample | ⊙ |
| 16 | | 55 | 30 | 15 | 5 × $10^2$ | O | Perpendicular Sample | O |
| 17 | 25 | 25 | 35 | 15 | 2 × $10^3$ | O | Perpendicular Sample | O |

TABLE 1-continued

| Experiment | Composition (wt %) | | | | Electrical Resistivity | Thermal Shock | | Corrosion |
|---|---|---|---|---|---|---|---|---|
| No. | ZrB2 | TiB2 | BN | AlN | (μΩ · cm) | Resistance | Sample | Resistance |
| 18 | | | | Mo | 6 | ○ | — | X |

Note that Nos. 1, 4, 5, 11, 13, 14, and 18 are comparative examples, and Nos. 2, 3, 6 to 10, 12, and 15 to 17 are examples.

The method of measuring the electrical resistivity, and the method of evaluating the thermal shock resistance and the corrosion resistance were as follows:

Electrical Resistivity . . .
(Total Resistance×Width of Sample
×Thickness of Sample)/Measurement
Distance Thermal Shock Resistance . . . The sample was inserted in a plasma (1,200° C.) of an Ar gas atmosphere at once, and occurrence of cracking and the like in the sample were visually observed. The evaluation was relatively performed in regard to two levels of o as good sample (no cracking) and x as bad sample (cracking occurred). As a sample, one having a size 20 mm×20 mm was used.

Corrosion Resistance . . . A plasma was generated in a corrosive gas atmosphere of $BF_3$, and the worn states of the sample Mo electrode exposed in the plasma were visually observed. The plasma density at this time was set to about $10^{12}$ ions/cm$^3$. A sample formed such that its surface parallel to the direction of pressure of hot press contacts the plasma atmosphere is called a parallel sample, and a sample formed such that its surface perpendicular to the direction of pressure of hot press contacts the plasma atmosphere is called a perpendicular sample. The evaluation was relatively performed in regard to three levels of ⊙ a sample substantially not worn when 50 hours have elapsed (rather good), o as a sample substantially not worn when 30 hours have elapsed (good), and x as a sample whose wear was confirmed before 30 hours have elapsed (bad). The experiments were performed by using the ion source of the ion implanting apparatus as the evaluation system and the respective materials of Table 1 to form the electrode of this ion source.

As is apparent from Table 1, it was confirmed that when the contents of $ZrB_2$ and/or $TiB_2$, and BN fell outside the ranges of the present invention, the corrosion resistance and the thermal shock resistance became bad, and that when AlN was contained, although the heat conductivity was improved, if its content exceeded 30 wt %, the corrosion resistance was degraded. Furthermore, when the parallel and perpendicular samples were compared, it was confirmed that the parallel sample had a better corrosion resistance.

In the above description, embodiments wherein the present invention is applied to the electron beam excitation ion source, the Freeman ion source, the plasma etching apparatus, and the plasma CVD apparatus have been described. However, the present invention is not limited to these embodiments, and can be applied to any apparatus, e.g., an ashing apparatus or an X-ray source, as far as it is an apparatus having a plasma generating unit.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus having a plasma generating unit for electrically transforming a gas to a plasma, comprising:
    a chamber;
    means for feeding a plasma generating gas into said chamber; and
    a pair of electrodes for generating an electric field, thereby generating a plasma of the gas,
    wherein at least portions of said electrodes contacting the plasma are constituted by a hot-press sintered body, having a surface to be exposed to a plasma atmosphere, said surface being parallel to a direction of the hot-press.

2. The apparatus according to claim 1, wherein said sintered body essentially consists of 40 to 60 wt % of at least one of $ZrB_2$ and $TiB_2$, 20 to 50 wt % of BN, and not more than 30 wt % of AlN.

3. The apparatus according to claim 1, wherein said apparatus is an ion source.

4. The apparatus according to claim 1, wherein said apparatus is an ion-implanting apparatus having an ion source.

5. The apparatus according to claim 1, wherein said apparatus is a plasma etching apparatus.

6. The apparatus according to claim 1, wherein said apparatus is a plasma film forming apparatus.

* * * * *